United States Patent
Mertens et al.

(10) Patent No.: US 6,851,435 B2
(45) Date of Patent: Feb. 8, 2005

(54) METHOD AND APPARATUS FOR LOCALIZED LIQUID TREATMENT OF THE SURFACE OF A SUBSTRATE

(75) Inventors: Paul Mertens, Bonheiden (BE); Marc Meuris, Keerbergen (BE); Marc Heyns, Linden (BE)

(73) Assignee: Interuniversitair Microelektronica Centrum (IMEC, vzw), Leuven (BE)

(*) Notice: Subject to any disclaimer, the term of this patent is extended or adjusted under 35 U.S.C. 154(b) by 24 days.

(21) Appl. No.: 10/074,706

(22) Filed: Feb. 13, 2002

(65) Prior Publication Data

US 2002/0125212 A1 Sep. 12, 2002

Related U.S. Application Data (63) Continuation of application No. 09/553,988, filed on Apr. 20, 2000, now Pat. No. 6,398,975, which is a continuation-in-part of application No. 09/159,801, filed on Sep. 23, 1998, now Pat. No. 6,491,764.
(60) Provisional application No. 60/084,651, filed on May 6, 1998, provisional application No. 60/079,688, filed on Mar. 27, 1998, and provisional application No. 60/059,929, filed on Sep. 24, 1997.

(30) Foreign Application Priority Data

Mar. 20, 1998 (EP) .......................................... 988700563

(51) Int. Cl.[7] .............................................. B08B 3/00
(52) U.S. Cl. ...................... 134/99.1; 134/2; 134/32; 134/33; 156/345.11; 156/345.17; 156/345.18
(58) Field of Search ............................... 134/2, 32, 33, 134/99.1, 902; 156/345.11, 345.17, 345.18

(56) References Cited

U.S. PATENT DOCUMENTS

| | | | |
|---|---|---|---|
| 4,838,289 A | 6/1989 | Kottman et al. ............ | 134/153 |
| 5,271,774 A | 12/1993 | Leenaars et al. ............... | 134/31 |
| 5,660,642 A * | 8/1997 | Britten ......................... | 134/30 |
| 5,705,223 A | 1/1998 | Bunkofske ................... | 427/240 |
| 5,749,413 A * | 5/1998 | Crowe ......................... | 165/80.1 |
| 5,873,380 A * | 2/1999 | Kanno ...................... | 134/102.1 |
| 5,887,605 A * | 3/1999 | Lee et al. ................ | 134/102.2 |
| 5,945,351 A | 8/1999 | Mathuni ...................... | 438/706 |
| 5,964,952 A * | 10/1999 | Kunze-Concewitz ........... | 134/2 |
| 5,997,653 A | 12/1999 | Yamasaka ...................... | 134/2 |
| 6,334,902 B1 * | 1/2002 | Mertens et al. ................. | 134/1 |

FOREIGN PATENT DOCUMENTS

| | | |
|---|---|---|
| JP | 02280330 | 11/1990 |
| JP | 02309638 | 12/1990 |
| JP | 7-211686 | * 7/1995 |
| JP | 11350169 | 12/1999 |

OTHER PUBLICATIONS

European Patent Office Search Report, Application No EP 00 87 0135.

* cited by examiner

Primary Examiner—Nadine G. Norton
Assistant Examiner—Shamim Ahmed
(74) Attorney, Agent, or Firm—McDonnell Boehnen Hulbert & Berghoff LLP (57) ABSTRACT

A method and apparatus for dispensing a liquid on the surface of a localized zone of a substrate, for example for cleaning of etching purposes. Along with the liquid, a gaseous tensio-active substance is supplied, which is miscible with said liquid and when mixed with the liquid, reduces the surface tension of said liquid, thus containing the liquid in a local zone of the substrate surface.

27 Claims, 11 Drawing Sheets

METHOD AND APPARATUS FOR LOCALIZED LIQUID TREATMENT OF THE SURFACE OF A SUBSTRATE

This application is a continuation of Ser. No. 09/553,988 filed Apr. 20, 2000 now U.S. Pat. No. 6,398,975, which is a continuation-in-part of Ser. No. 09/159,801 filed Sep. 23, 1998 now U.S. Pat. No. 6,491,764, and claims benefit of provisional No. 60/059,929 filed Sep. 24, 1997, and claims benefit of provisional No. 60/079,688 filed Mar. 27, 1998, and claims benefit of provisional No. 60/084,651 filed May 6, 1998.

FIELD OF THE INVENTION

The present invention is related to a method of localized liquid treatment of the surface of a substrate, like cleaning or etching. The invention is also related to an apparatus used to perform said treatment. Application of the invention is possible in a number of wet processing steps which are frequently used, e.g. in the fabrication of integrated circuits or liquid crystal displays.

BACKGROUND OF THE INVENTION

In the fabrication of micro-electronic devices such as integrated circuits or liquid crystal displays, a substrate has to go through a number of fabrication steps, including wet etching, wet cleaning or rinsing.

In the documents U.S. Pat. No. 5,271,774 and Japanese Patent JP-A-07211686, methods are described to remove a liquid from the surface of a substrate by applying a gaseous substance to the substrate, which, when mixed with the liquid, reduces the surface tension of the liquid, so that it can be easily removed from the surface by a centrifugal force, i.e. by subjecting the substrate to a rotary movement. However, these methods are only applicable to the substrate as a whole, and cannot be used for local treatment of the substrate. Document EP-A-817246 is describing an apparatus and method for wet cleaning or etching of flat substrate surfaces, whereby a substrate is moved through a stationary amount of liquid. This method is also related to a treatment of the substrate as a whole, not of a local zone of said substrate.

During some processing steps, an annular edge area of the substrate is treated, for example for the removal of certain layers, like a resist or a metal film (e.g. Cu). Sometimes, it is only the outer rim of the substrate which is treated, while the top and bottom surfaces of the substrate must remain untouched.

Techniques exist whereby a beam of liquid is directed to the edge area or the rim of a rotating substrate in order to perform these process steps. However these existing techniques offer a poor protection of the substrate surface against the cleaning liquid. It would therefore be advantageous to find a way of protecting the substrate surface while treating said annular edge area or its outer rim with a liquid. Another disadvantage of existing techniques is that the rotational speed of the substrate during processing must be relatively high, which is particularly problematic for large substrates.

Some processing steps require the removal of larger sized features from the substrate surface, e.g. for revealing underlying zero markers, which are used for the accurate lateral positioning during processing, e.g., during photographic exposure. Although the definition of the zero markers themselves requires high accuracy, the accuracy requirements of the window for removing a layer on top of the zero markers can be fairly relaxed. So far in the state of the art, the use of a photo resist step is mostly used to accomplish these areas. By using a photo resist step, a patterned protective resist layer is obtained on the substrate surface. The pattern is such that the areas to be etched are not covered with resist. After this, the substrate is etched and the photo resist layer is removed. This is however an expensive and time-consuming effort.

An alternative way of producing such larger sized areas which are free of film, consists of a local shielding by shielding plates during film deposition. However, this technique leads to an increased risk of particle contamination and scratch formation on the substrate. Furthermore, this shielding technique is not generally applicable. It requires compatibility of the shielding plates with the deposition process of interest. To produce these larger sized features, it would therefore be advantageous to find a method that allows less accuracy but lower cost and higher processing speed, without creating any particle contamination.

Document JP-A-11166882 describes a pre-concentration or collection technique, used in contamination measurements for semi-conductors. It is a technique, whereby a droplet is moved over the substrate surface, in order to collect contaminants and subsequently analyze their concentrations. Currently, this technique is mainly used on silicon surfaces, by rendering the surface hydrophobic by way of an HF-treatment. This way, the water-based droplet is contained. The technique is however not confined to silicon surfaces. In some cases, it has been observed that the contact angle between the droplet and the substrate surface is insufficient. Furthermore, it would be advantageous to find a method whereby, in the case of silicon surfaces, the extra processing step of providing an HF-treatment would become unnecessary.

Document U.S. Pat. No. 5,492,566 describes a way of holding a substrate to a flat surface by way of the Bernoulli effect. By supplying a gas at a high speed between said substrate and said surface through an annular nozzle, a pressure drop will result, under said substrate, thus holding said substrate to said surface. Substrates held in this way can be subjected to various wet treatment steps, like cleaning or etching. However, a danger exists of liquid attaching itself to the rim or the backside of the substrate.

SUMMARY OF THE INVENTION

The present invention relates to a method of dispensing liquid on a part of a substrate for processing of the substrate, e.g. for cleaning or etching purposes, while another part of said substrate is prevented from contacting said liquid, said method comprising the steps of:

supplying a liquid on a part of said substrate; and simultaneously with said step of supplying a liquid, supplying a gaseous tensio-active substance to a surface, said gaseous substance being at least partially miscible with said liquid and when mixed with said liquid yielding a mixture having a surface tension lower than that of said liquid.

A first embodiment of the invention is a method wherein said substrate is circular shaped, wherein the step of supplying a liquid on a part of said substrate includes supplying at least one stream of a liquid so that said stream hits a flat surface of said substrate in an area of said surface, said area being adjacent to an outer rim of said substrate, wherein the step of supplying a gaseous tensio-active substance to said surface includes supplying at least one stream of a gaseous tensio-active substance to the flat surface of said substrate so that said stream hits said surface in an area which is adjacent to the area hit by said liquid stream, and closer to the center of rotation, and further comprising the step of:

rotating the circular shaped substrate about an axis of rotation, preferably in a horizontal plane, the axis being perpendicular to the substrate surface and through a center of gravity said substrate.

An additional stream of liquid may be supplied to the opposite surface of said substrate, in order to treat the whole of said opposite surface.

According to another embodiment of the invention, a stream of liquid may be directed at the outer rim of the substrate, while the flat surfaces are protected from said liquid by a stream of a gaseous tensio-active substance.

Another embodiment of the invention is a method wherein the substrate is circular shaped and has two sides, a first side consisting of an annular edge area and a central area, the method further comprising the step of holding the circular shaped substrate, wherein the step of supplying a liquid on a part of said substrate includes supplying a stream of liquid to the entire annular edge area of the first side of the substrate, and wherein the step of supplying a stream of a gaseous tensio-active substance includes supplying a stream of a gaseous tensio-active substance to the central area of the surface.

In this method, the substrate may be subjected to a rotational movement, the axis of rotation being perpendicular to the substrate surface and comprising the center of said substrate.

An additional stream of liquid may be supplied to a surface which is opposite to a surface of which the annular edge area is treated, in order to treat the whole of said opposite surface.

Another embodiment of the present invention is a method wherein a substrate is circular shaped, wherein the step of supplying a gaseous tensio-active substance to said surface includes supplying streams of a gaseous tensio-active substance to border areas between said amount of liquid and said flat surfaces, and further comprising the steps of:

holding the circular shaped substrate, and providing a means of bringing an annular edge area of both flat surfaces of said substrate, and the outer rim of said substrate into contact with an amount of liquid.

In this method, the substrate may be subjected to a rotational movement, the axis of rotation being perpendicular to the substrate surface and comprising the center of said substrate.

Another embodiment of the present invention is a method, wherein the substrate has two sides, a first side and a second side, further comprising the step of placing the second side of the substrate on a flat, rotating surface, said rotating surface containing an annular channel, so that said second side of said substrate is covering said channel, wherein said step of supplying a gaseous tensio-active substance includes supplying a stream of gaseous tensio-active substance through said annular channel and in the direction of said substrate, so that said substrate is held on said rotating surface by a Bernoulli effect, and wherein said step of supplying a liquid on a part of said substrate includes supplying a stream of the liquid on the first side of said substrate.

Another embodiment of the present invention is a method, wherein the substrate has a first side and a second side, wherein the step of supplying a liquid on a part of said substrate includes supplying, through a first channel, a continuous stream of liquid to a part of the first side of the substrate which is preferably horizontally placed, further comprising the step of draining said stream of liquid from said first side through a second channel, the second channel being concentrically placed around the first channel, and wherein the step of supplying a gaseous tensio-active substance includes supplying to said first side a stream of a gaseous tensio-active substance around said second channel, to prevent remainder liquid from making contact with the first side of the substrate which is not contained within the second channel.

In this embodiment, the gaseous tensio-active substance may be drained from the substrate surface through an additional channel.

Another embodiment of the present invention is a method, wherein the step of supplying a liquid on a part of said substrate includes bringing an amount of liquid into contact with a part of a flat surface which is preferably horizontally placed, and wherein the step of supplying a gaseous tensio-active substance to said surface includes supplying to said surface a stream of gaseous tensio-active substance around said amount of liquid, thereby preventing said liquid from making contact with the rest of said surface.

In this embodiment, the gaseous tensio-active substance may be drained from the substrate surface through an additional channel.

The present invention is also related to an apparatus for subjecting a substrate to a localized liquid treatment for cleaning or etching of the substrate, said apparatus comprising means for holding said substrate, a first supply system adapted to supply a liquid on a first part of the surface of said substrate, and a second supply system adapted to supply a gaseous substance to a second part of said substrate, the second part of the substrate adjacent to the first part which is treated by said liquid.

In such an apparatus, a means may be provided for rotating said substrate around an axis which is perpendicular to said substrate and which comprises the center of said substrate.

According to one embodiment, an apparatus is proposed for treating an annular edge area of at least one flat surface of a circular shaped, preferably horizontally placed substrate, comprising at least one fixed pair of nozzles, a nozzle being defined as an apparatus able to supply a contiguous stream of liquid. Of this pair, one nozzle is used to supply a stream of liquid on said annular edge area, while the other is used to dispense a gaseous tensio-active substance on an area of said flat surface adjacent to said annular edge area, and closer to the center of said substrate.

Said pair of nozzles may be positionable on any location along a fixed radius of said substrate. A nozzle may be added on one of the flat surfaces of said substrate which is opposite to a surface of which the edge area is treated, said nozzle being used to dispense a stream of liquid on the whole of said opposite surface.

According to another embodiment, an apparatus is provided for treating an annular edge area of a flat surface of a circular shaped substrate, the apparatus having a first supply system and a second supply system, wherein the substrate has a geometric center, an axis which is perpendicular to said substrate at the geometric center of said substrate, a central part around the axis of the substrate and an annular edge, wherein said first supply system includes a first annular channel adapted to supply the liquid to the entire annular edge area of the surface of said substrate, wherein said second supply system includes a central channel adapted to supply a gaseous substance to the central part of said substrate, the central channel being coaxial with the axis of the substrate, and wherein said second supply system further includes a second annular channel placed concentrically with respect to the first channel and closer to the geometric center of said substrate, said second channel adapted to guide the gaseous substance coming from the central part of said substrate, in order to prevent said liquid from touching said central part.

Said apparatus may rotate around an axis which is perpendicular to said substrate and which comprises the center of said substrate. A nozzle may be added on one of the flat surfaces of said substrate which is opposite to a surface of which the edge area is treated, said nozzle being used to dispense a stream of liquid on the whole of said opposite surface.

A sealing device may be added between said substrate and the outer wall of said second annular channel.

According to another embodiment, an apparatus is proposed for treating an annular edge area of both flat surfaces and the outer rim of a circular shaped substrate, placed preferably in a horizontal plane, comprising:

means for holding said substrate, a first supply system adapted to supply a liquid on a first part of the surface of said substrate, a second supply system adapted to supply a gaseous substance to a second part of said substrate, a container filled with an amount of treatment liquid so that a pressure is maintained above the surface of said amount of treatment liquid, said pressure being less than or equal to an ambient pressure, said container having a narrow gap in one side, into which said circular substrate is partially inserted, so that at least a portion of said annular edge and said outer rim of said substrate is immersed in said liquid, and at least one pair of nozzles, one nozzle of said pair on each side of said substrate, directing a stream of a gaseous substance at a border area between said container and said substrate.

Said apparatus may rotate around an axis which is perpendicular to said substrate and which comprises the center of said substrate.

According to another embodiment, an apparatus is proposed for treating a local zone of a preferably horizontally placed substrate, said apparatus comprising a first supply system including a central channel used to supply a stream of liquid to the surface of said substrate and a second channel, concentrically surrounding the first channel, and draining said stream of liquid from the surface of said substrate; and a second supply system including a third channel, concentrically surrounding the second channel and used to supply a stream of a tensio-active substance to the substrate surface.

According to the same embodiment, a fourth channel may be concentrically placed with respect to said third channel, said fourth channel being used to drain said gaseous tensio-active substance from the substrate surface.

A sealing device may be added between said substrate and the outer wall of said second channel. In case of a fourth channel, an additional sealing device may be placed between said substrate and the outer wall of the apparatus.

According to another embodiment, an apparatus is proposed for treating a local zone or for collecting impurities from the surface of a preferably horizontally placed substrate, said apparatus comprising:

a first supply system including a central channel, the central channel containing an amount of a liquid such that said liquid is in contact with the surface of said substrate, and that a pressure is maintained above a surface of said amount of liquid, said pressure being less than or equal to an ambient pressure on the substrate surface, and a second supply system including a second channel, the second channel concentrically surrounding the central channel, and supplying a stream of a gaseous tensio-active substance on the surface of said substrate.

According to the same embodiment, a third channel may be placed concentrically with respect to said second channel, said third channel being used to drain said gaseous tensio-active substance from the substrate surface.

A sealing device may be added between said substrate and the outer wall of said central channel. In case of a third channel, an additional sealing device may be placed between the substrate and the outer wall of the apparatus.

An object of the present invention is to provide a method and apparatus to perform a liquid treatment of a part of a substrate, such as a cleaning or etching step, while another part of said substrate is protected from said liquid by the use of a gaseous substance.

SHORT DESCRIPTION OF THE DRAWINGS

FIG. 3b (sectioned front view and top view) represents an alternative form of the apparatus shown in FIG. 3a.

DETAILED DESCRIPTION OF THE PREFERRED EMBODIMENTS

Figure 1A:
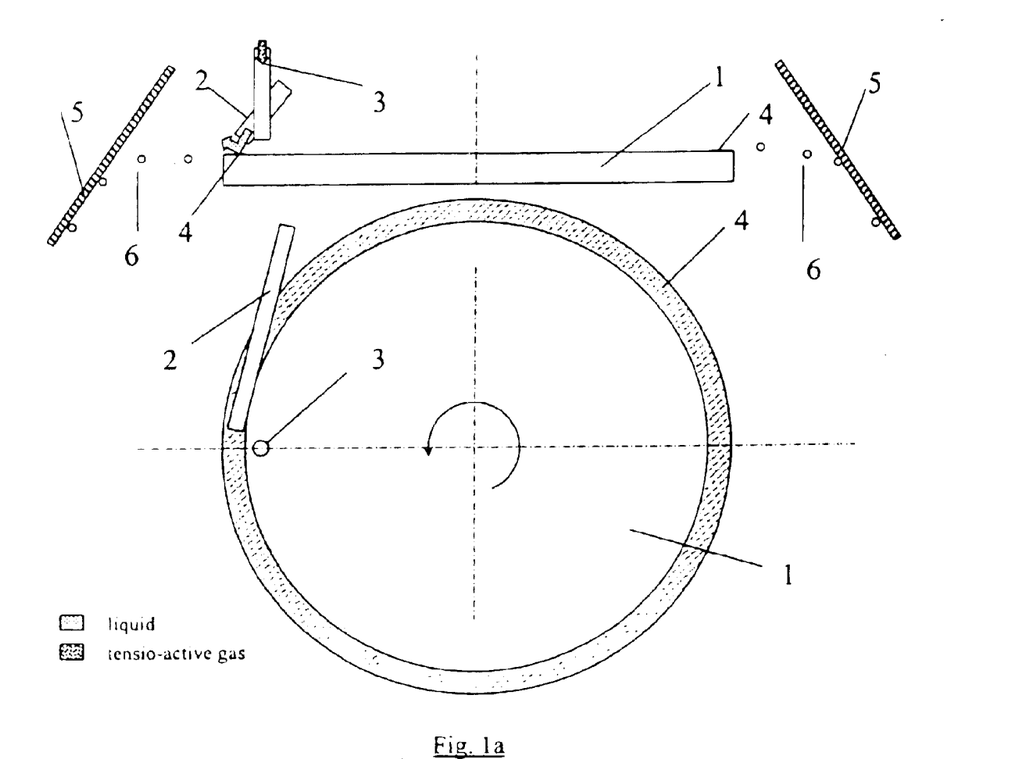
FIG. 1a (front and top view) describes the method and apparatus according to a first embodiment of the invention, used to clean or etch an edge area of a rotating substrate.

The presently preferred embodiments of the invention will now be described by reference to the accompanying figures, wherein like elements are referred to by like numerals. FIG. 1a describes the method and apparatus according to a first embodiment of the invention, whereby a liquid, used for cleaning or etching, is supplied on a horizontally placed rotating circular shaped substrate 1 through a first nozzle 2, while a gaseous tensio-active substance is supplied through a second nozzle 3. The rotation of the substrate is indicated by the arrow. The rotation in this and all following embodiments (if a rotation is applied) is occurring around the axis perpendicular to the substrate and comprising the center of said substrate.

In the apparatus of FIG. 1a, both nozzles are placed such that the streams of liquid and tensio-active substance hit the substrate surface on two spots which are preferably lying along a radius of said substrate. The spot where the liquid stream hits the surface is lying on an annular edge area 4, the spot where the stream of tensio-active gas hits the surface is lying next to the first spot and closer to the center of the substrate. Both nozzles are fixed. The liquid, supplied through nozzle 2 can be used to clean or etch a well defined annular edge area 4 of the surface of the substrate, while the rest of said surface is protected from making contact with the liquid, by the gaseous tensio-active substance. This substance, when mixed with the liquid, reduces the surface tension of said liquid, so that it does not spread out over said surface, but becomes contained and is easily removed from the surface by the centrifugal forces, resulting from the substrate's rotational movement. The walls 5 of the compartment in which the substrate is placed are slanted, so that they can provide an efficient removal of liquid droplets 6, without splashing onto the substrate.

The angles between the nozzles and the substrate surface may differ from the exemplary case of FIG. 1a. It is beneficial for the liquid nozzle to be placed at an angle which minimizes splashing. Both nozzles may be placed on a movable structure, so that they can be fixed at a variable position along the radius of said substrate. Several pairs of nozzles (2,3) may be placed on fixed positions on one or both sides of the substrate.

This embodiment represents an improvement on the state of the art in that it allows the treatment of a localized edge area of the substrate surface, without contacting the central part of said substrate. An additional advantage of the method according to the invention is that it allows a rotational movement of the substrate at a lower speed, compared to existing methods.

Figure 1B:
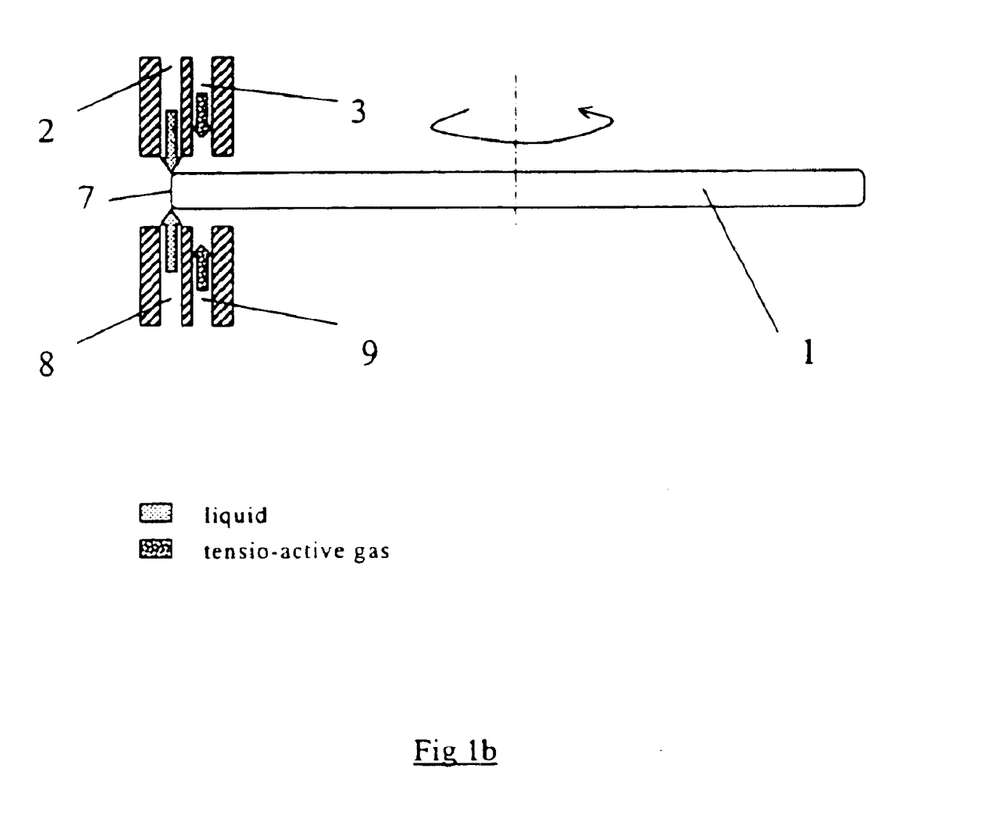
FIG. 1b (front view) describes a method and an apparatus for treating the outer rim of a rotating substrate.

If said nozzles are directed at the outer rim 7 of the substrate, as in FIG. 1b, the method according to the invention is suitable for the treatment of the rim, whereby the surface of the substrate is protected from the liquid. A second pair of nozzles 8 (liquid) and 9 (gaseous tensio-active substance) may be added on the opposite side of the substrate, to improve the efficiency of the rim treatment process.

Figure 1C:
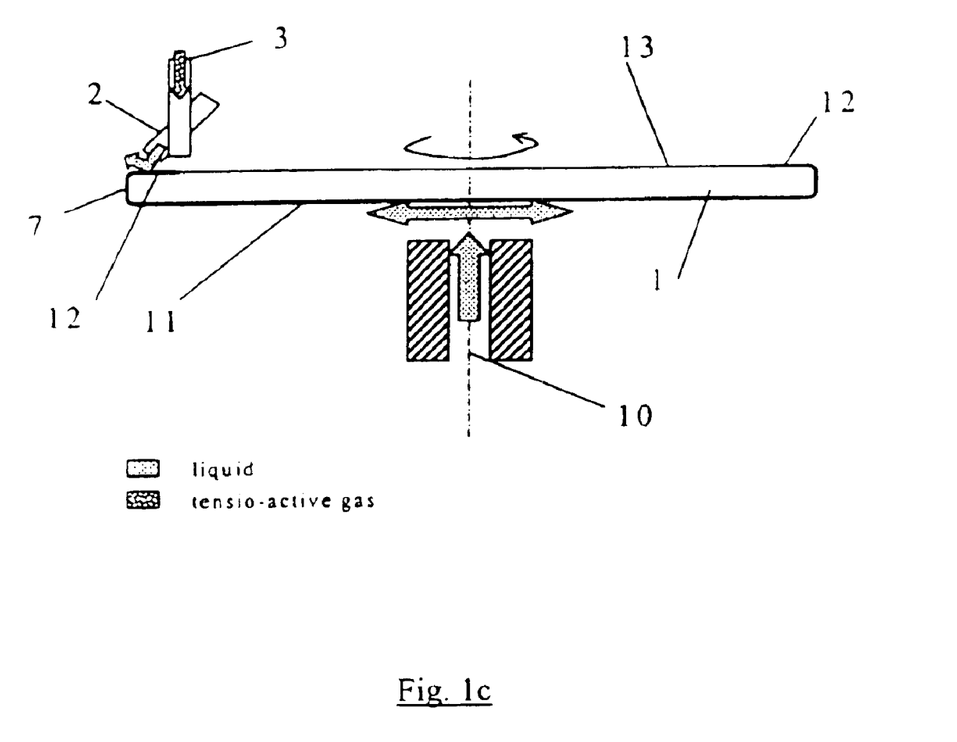
FIG. 1c (front view) describes the method and an apparatus according to the invention for performing a backside cleaning.

An additional nozzle 10 may be added on the opposite side of the substrate, as is shown in FIG. 1c. This setup is then suitable for the process of backside cleaning or etching, in which the backside 11 of the substrate is treated as well as a limited area 12 of the front side, and the outer rim 7. Using the method of invention, the central part 13 of the front side of the substrate can be effectively shielded from the treatment liquid.

Figure 2:
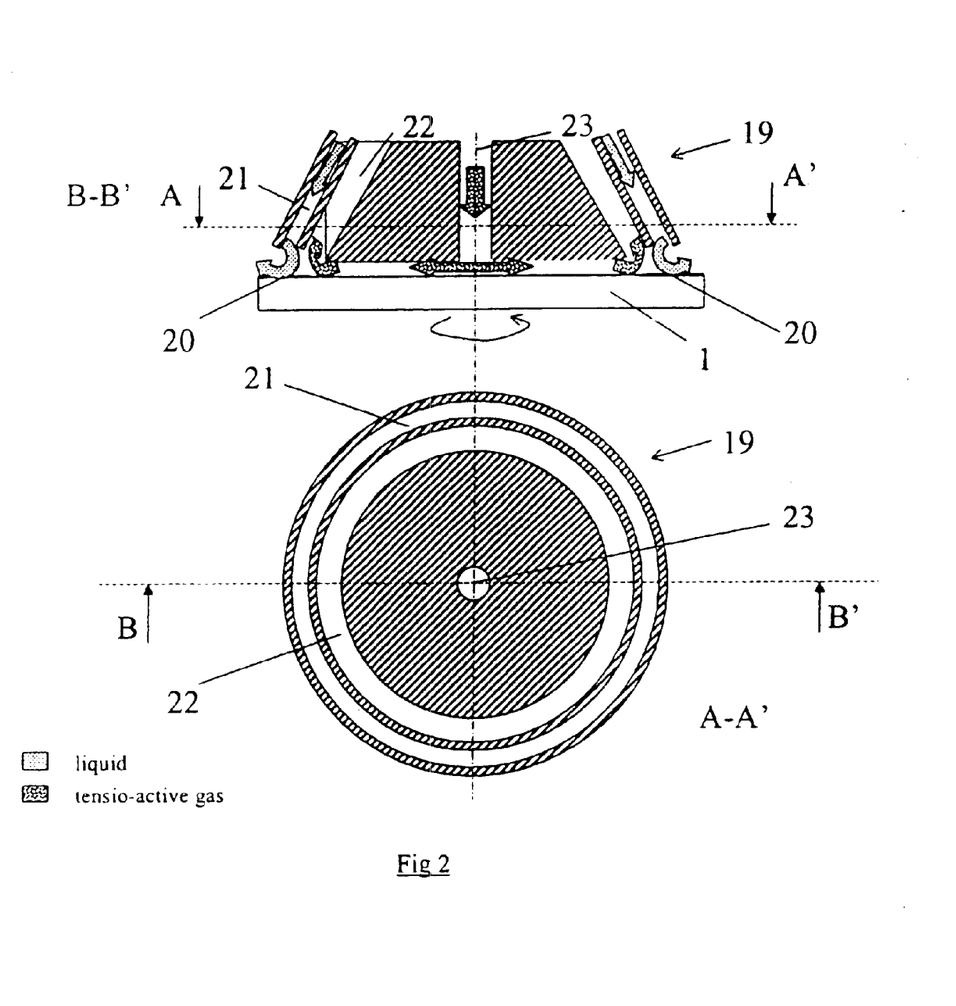
FIG. 2 (front and top sectioned view) describes a second method and apparatus according to the invention, used to clean or etch an annular edge area of a substrate.

FIG. 2 describes the method and apparatus according to another embodiment of the invention, in which a liquid is dispensed on an annular edge area 20 of a circular shaped substrate 1. The substrate may be stationary or rotating. An apparatus 19 is placed above the surface of the substrate, consisting of two concentric annular channels 21 and 22. Said apparatus may also be rotating around the central perpendicular axis of the substrate. Through the outer channel 21, a liquid is supplied on the edge of the rotating substrate. At the same time a gaseous substance which is preferably tensio-active, is supplied on the central part of the substrate, through a central nozzle 23. The gaseous tensio-active substance is flowing outward from the center of the substrate to the edge, where it is guided through the inner concentric channel 22. Said gaseous substance reduces the surface tension of the liquid in such a way that the liquid is prevented from making contact with the central part of said surface. In case the substrate is rotating, the centrifugal forces acting on the liquid will further facilitate the removal of the liquid from the surface.

This embodiment allows also to treat an edge area of the substrate, presenting the added advantage that the liquid can be applied to the whole of the edge area, which is also protected as a whole by the centrally supplied gaseous tensio-active substance. The same structure may be placed on the opposite side of the substrate, in order to treat both edge areas simultaneously. Also, in case one apparatus 19 is applied, a nozzle may be directed at the opposite side, supplying liquid on said opposite side, analogous to the action of nozzle 10 in FIG. 1c. The distance between the apparatus 19 and the substrate surface must be sufficiently small, to optimize the separation between the liquid and the gas.

In case both the apparatus 19 and the substrate 1 are stationary or rotating at the same speed, a sealing device, e.g. an O-ring, may be placed between the substrate and the outer wall of channel 22, to separate the central part from the treated edge area.

Figure 3A:
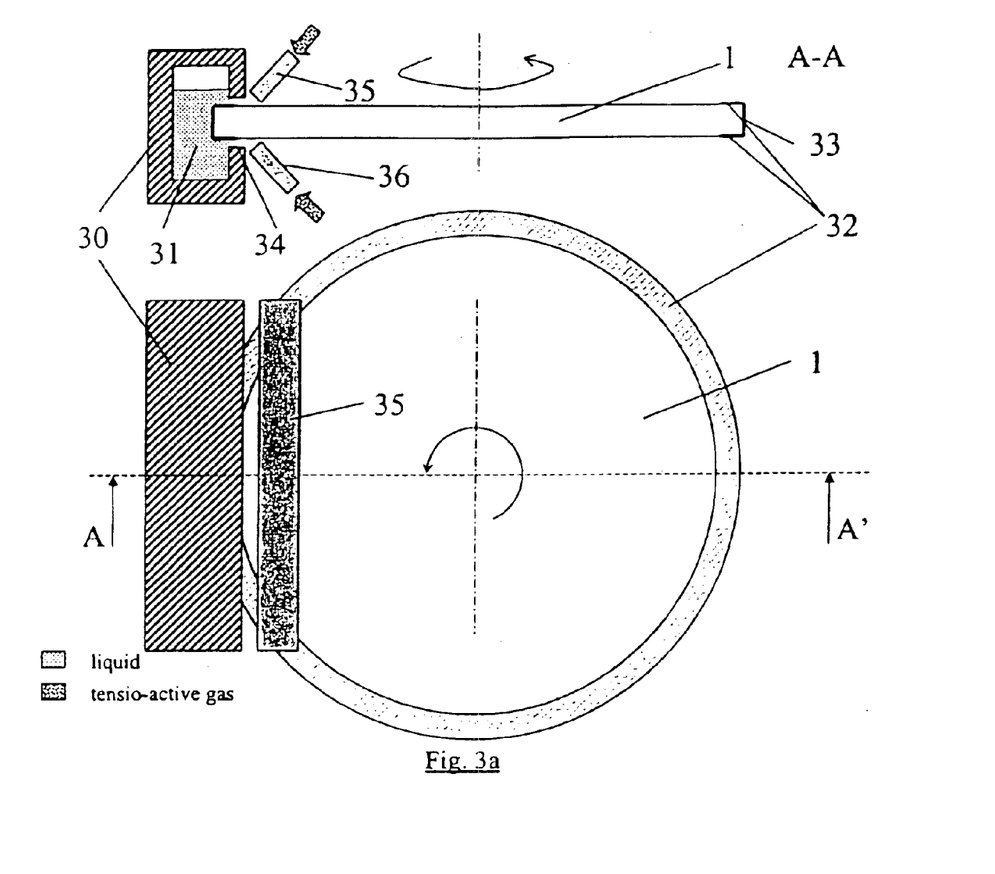
FIG. 3a (sectioned front view and top view) describes a third method and an apparatus according to the invention, used to clean or etch an annular edge area and the outer rim of the substrate.

FIG. 3a describes the method and apparatus according to another embodiment of the present invention, in which a substrate 1 is subjected to a rotational movement. To one side of the substrate is a container 30, containing a liquid 31, to be used for the treatment of the edge areas 32 and the outer rim 33 of the substrate 1. The gap 34 is made so that it can receive the rotating substrate's edge, with very small clearances. The pressure inside said container 30 is preferably lower than or equal to the pressure outside said container. Nozzles (35, 36) are present on both sides of the substrate, supplying streams of a gaseous substance which is preferably tensio-active, to the border area between the container and the substrate, thereby preventing the liquid from touching the central part of the substrate.

In one aspect of this embodiment, the container may be rotating around the substrate's central perpendicular axis, at the same or a different speed as the substrate. In this manner, the centrifugal forces will contribute to the efficient separation between the liquid and the central area of the substrate. Also, the substrate may be stationary, while the container is rotating.

Figure 3B:
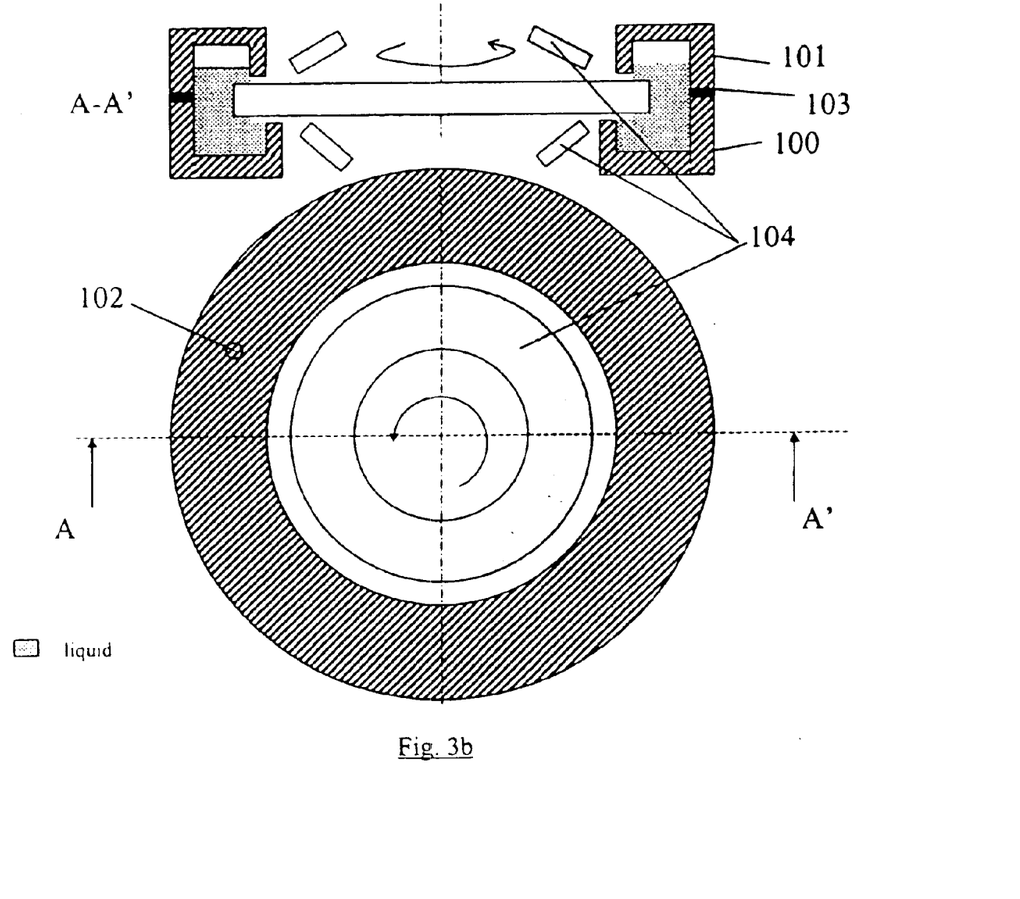

The container may even be of an annular form, so that the whole of the edge area to be treated is immersed in the treatment liquid. Also in this case, said annular-shaped container may rotate at a speed, equal to or different from the speed of said substrate. In this case also, the substrate may be stationary. If the container has an annular form, as is shown in FIG. 3b, it should consist of two parts: a bottom part 100 in which to place the substrate, and a top part 101 which is placed onto the first part, after which the compartment between both parts is filled with a treatment liquid, e.g. via at least one opening 102 so that the substrate's annular edge area is totally immersed in said liquid. Along the outer perimeter of both parts of said container, a suitable sealing device 103 should be provided between said parts so that no treatment liquid can escape from the container. Annular shaped nozzles 104 may be used to supply an equal amount of the gaseous tensio-active substance to the border areas between the container and the substrate.

This embodiment presents the added advantage that the edge areas of both sides and the outer rim of the substrate can be treated simultaneously.

For holding a substrate and subjecting it to a rotational movement in one of the previous embodiments of the present invention, a planetary drive system can be used. In such a system, a set of rotating grooved wheels located around the perimeter of the round substrate, hold and directly drive the substrate. This offers an efficient removal of edge beads. Also, there is a free access to both sides of the substrate. Alternatively, a vacuum chuck may be used to hold the substrate.

Figure 4:
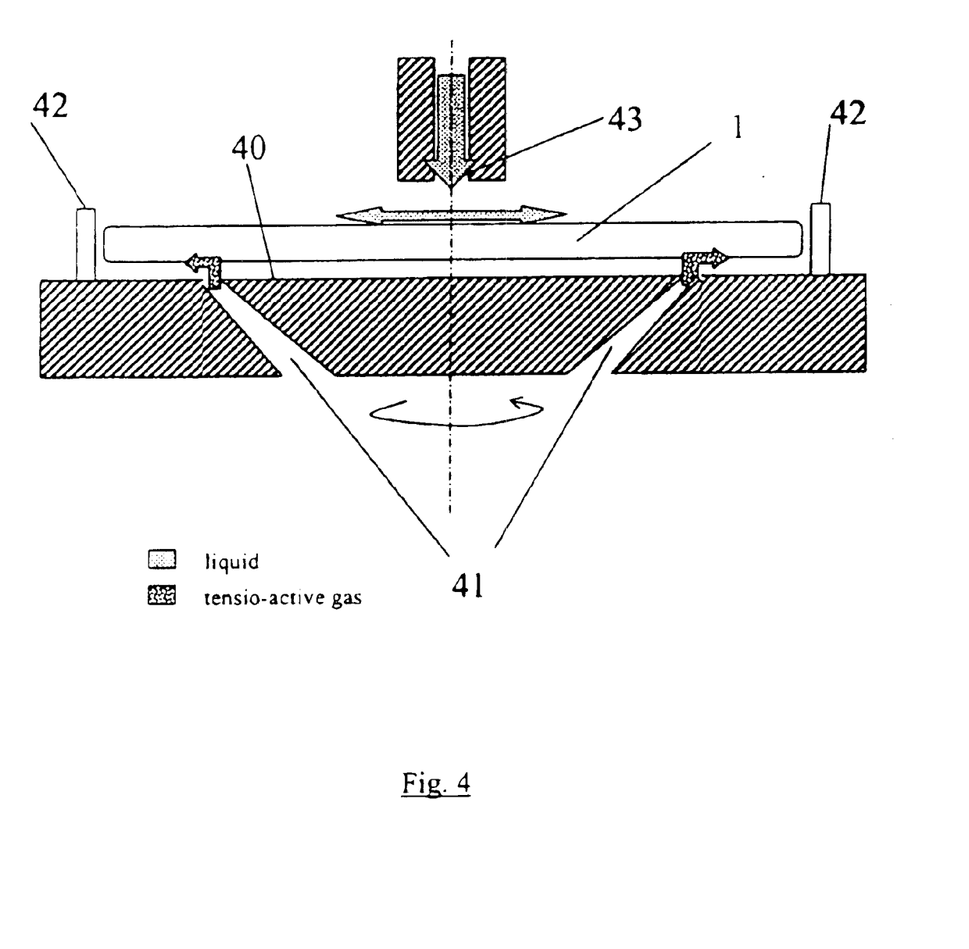
FIG. 4 (front view) describes the method according to the invention, used to hold a substrate by way of the Bernoulli effect.

FIG. 4 describes the method according to another embodiment of the invention, in which a stream of a gaseous tensio-active substance is used to hold a substrate 1 by way of the Bernoulli effect. The substrate 1 is placed on a flat rotating surface 40 in which an annular nozzle 41 is provided. The rotation of said surface 40 is indicated by the arrow. Through this nozzle, a tensio-active gaseous substance is supplied at a certain speed. This speed is responsible for a pressure drop between the substrate and the flat surface, causing the substrate to be held to said surface. Supports 42 are mounted on the surface 40 to ensure that the substrate is kept in place.

A nozzle 43 is placed on the opposite side to the annular nozzle and is used to supply a stream of treatment liquid. This embodiment is suitable for the process of thinning of the substrate, by applying an etching fluid on one surface, while the opposite surface is effectively protected by the tensio-active gas.

Figure 5A:
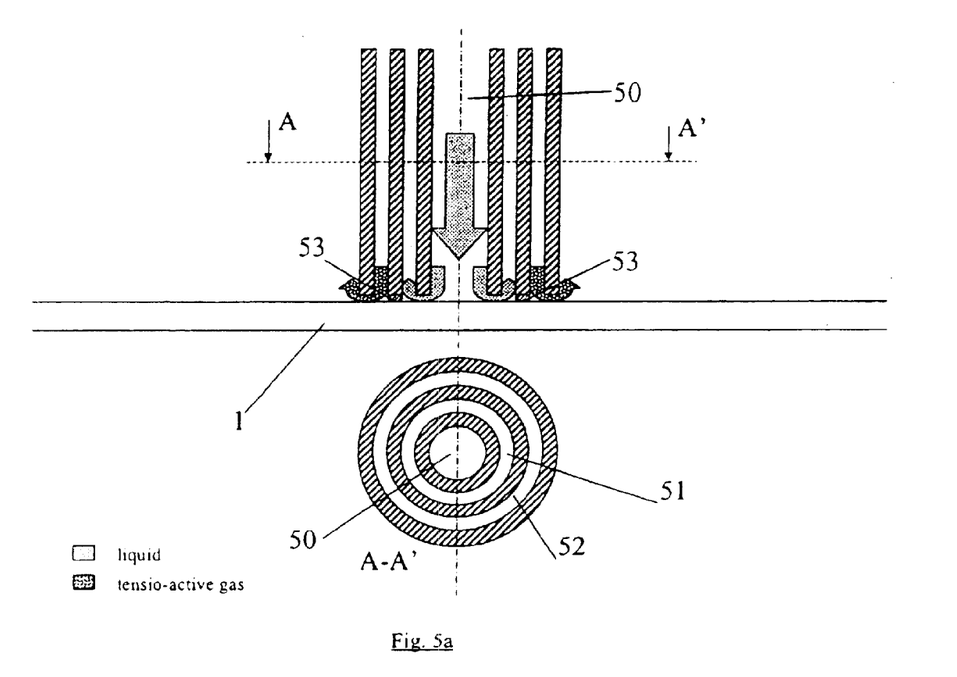
FIGS. 5a and b (front and top sectioned view) describes the method and an apparatus according to the invention, used to clean or etch a local area of a substrate by applying a continuous stream of a liquid.

FIG. 5a describes the method and apparatus according to another embodiment of the invention, in which a continuous stream of liquid is supplied on the surface of the substrate 1. An apparatus is used, consisting of three concentric channels. The central channel 50 is used to supply the liquid on the surface of the substrate. The surrounding channel 51 is used to drain the liquid from said surface. The third channel 52 is used to supply a gaseous tensio-active substance which reduces the surface tension of the liquid so that it is contained on a localized area of the surface. A sealing device, e.g. an O-ring 53, may be added between the substrate and the outer wall of the liquid draining channel 51. In this case, the stream of gaseous tensio-active substance makes sure that any liquid leaking through the seal is contained on the area to be treated.

Figure 5B:
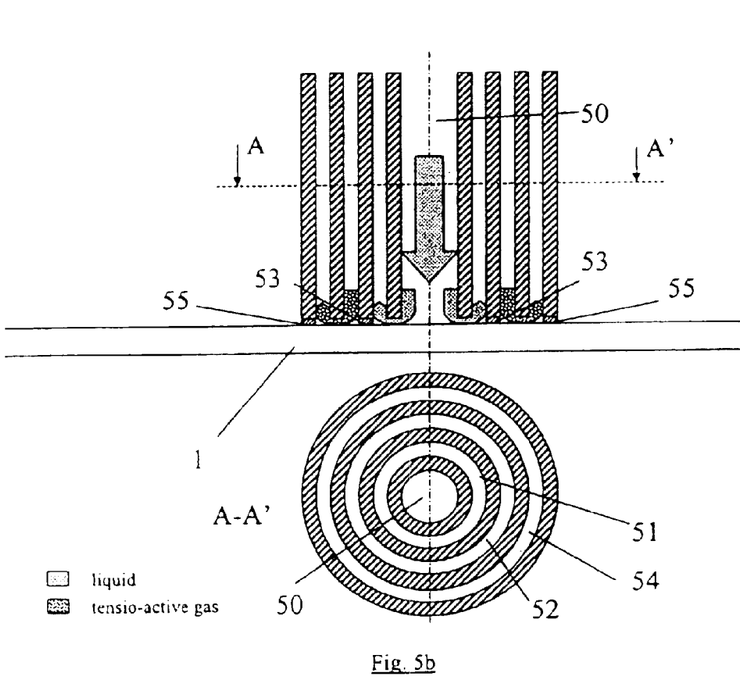

FIG. 5b reveals an additional fourth channel 54 surrounding channel 52, which may be placed in case the gaseous substance must be prevented from touching the rest of the substrate or from leaking out into the environment. The arrows indicate that the gaseous tensio-active substance is drained from the surface of the substrate through this fourth channel. However, it is equally possible for the gas to be supplied through the fourth channel 54 and drained through the third channel 52.

Whatever the direction of the stream of gaseous tensio-active substance in the apparatus of FIG. 5b, an additional sealing device 55 may be placed between the substrate and the outer wall of the apparatus, in order to prevent the gaseous substance from leaking into the environment. Specifically, if the third channel 52 is positioned in the outermost portion of the device (the configuration is such that the fourth channel 54 is placed between the second channel 51 and the third channel 52), a sealing device may be placed at the outermost portion of the third channel 52. Alternatively, if the fourth channel is placed outside of the third channel such that the fourth channel is the outermost portion of the device, a sealing device 55 may be placed for the fourth channel. In this manner, the placement of the fourth channel (either between the second and third channel or outside of the third channel) allows for the gas to be removed out of the system in two different directions. And, a sealing device may be placed between the substrate and the outer wall of the last concentric channel in the apparatus.

The device containing the three or four channels may be designed so that it covers the area to be treated exactly, or it may be made smaller and subsequently be scanned over the area to be treated.

The device containing the three or four channels may advantageously be placed under a horizontally placed substrate. In this way, a splashing of liquid on the substrate when removing the device may be avoided.

This embodiment can be used to clean local areas of the substrate surface, or to etch these areas, such as zero marker areas, without requiring a photo-resist pattern or shielding plates. For the production of such larger sized film-free areas, this method presents a quicker and cheaper way compared to the classic photo step method. Compared to the method using shielding plates, the method according to the present invention eliminates the danger of particle contamination or scratch formation.

Figure 6A:
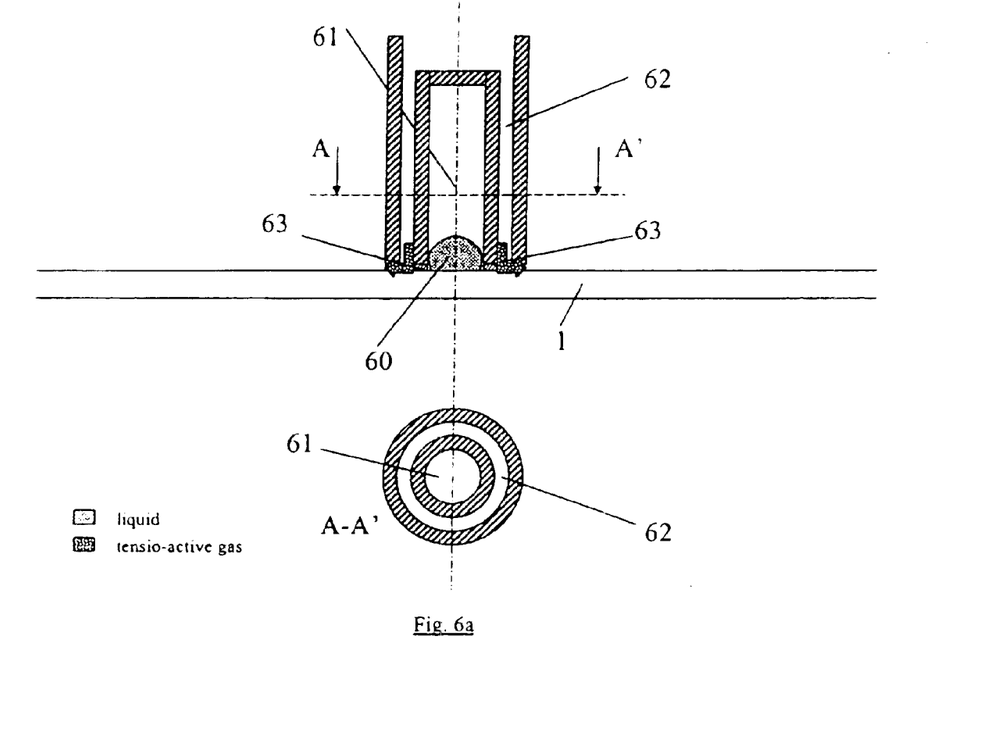
FIGS. 6a and b (front and top sectioned view) describes the method and apparatus according to the invention, used to contain a small amount of a liquid on a part of the surface of the substrate.

FIG. 6a describes the method and apparatus according to another embodiment of the invention, which is suitable for the technique of impurity collection. It may also be suitable for obtaining larger sized film-free areas, like zero-markers. An amount of liquid 60 is put into contact with the surface of the substrate 1 through a central channel 61. This channel is closed off on the top side. Advantageously, the pressure inside the channel 63 is lower than the ambient pressure acting on the substrate surface. The lower the pressure above the liquid, the higher the amount of liquid which can be contained. A channel 62 which is placed around the channel 61 is used to supply a gaseous tensio-active substance, which reduces the surface tension of the liquid so that said liquid is contained on a localized area of the surface. In case a droplet of said liquid is used, a reduction of the pressure above said droplet is unnecessary. In this case, the central channel 61 may be open on top.

A sealing device such as an O-ring 63 may be added between the substrate and the outer wall of the channel 61. In this case, the stream of gaseous tensio-active substance would make sure that any liquid leaking through the seal is contained on the area to be treated.

Figure 6B:
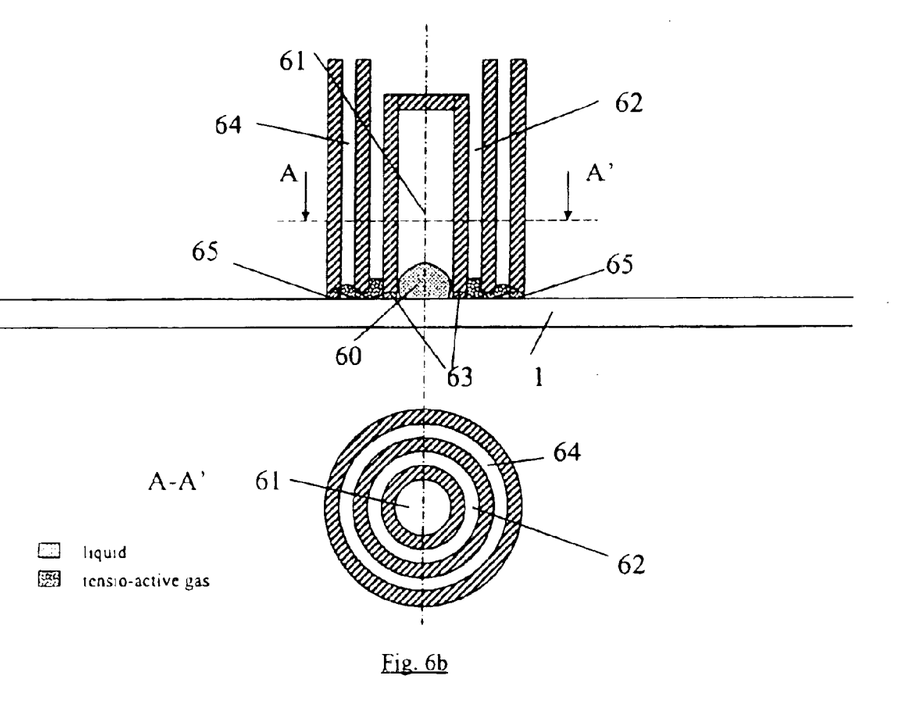

In FIG. 6b, an additional channel 64 is added to the apparatus. This version of the apparatus is preferred when the gaseous tensio-active substance must be prevented from touching the rest of the substrate or from leaking into the environment. The arrows indicate that the gaseous tensio-active substance is drained from the surface of the substrate through this third channel 64. However, it is equally possible for the gas to be supplied through the third channel and drained through the second channel.

Whatever the direction of the stream of gaseous tensio-active substance in the apparatus of FIG. 6b, an additional sealing device 65 may advantageously be placed between the substrate and the outer wall of the apparatus, in order to prevent the gaseous substance from leaking into the environment.

This embodiment represents an improvement compared to the existing techniques described in the state of the art, as it is capable of holding an amount of liquid, larger than a droplet, so that a larger amount of contaminants can be collected. In case a droplet is used, the flow of the gaseous tensio-active substance increases the contact angle between the droplet and the surface to be treated. Eventually, it may render the pre-treatment of the substrate surface of hydrophilic substrates unnecessary.

It is intended that the foregoing detailed description be regarded as illustrative rather than limiting and that it is understood that the following claims, including all equivalents, are intended to define the scope of the invention.

What is claimed is:

1. An apparatus for subjecting a substrate to a localized liquid treatment for cleaning and/or etching of the substrate, the apparatus comprising:

support for holding the substrate, a first supply system adapted to supply a liquid on a first part of the surface of the substrate, and a second supply system adapted to supply a gaseous tensio-active substance to a second part of the substrate, the second part of the substrate substantially adjacent to the first part, wherein the first and second supply systems are positioned to inhibit the liquid from substantially contacting the second part of the substrate and to cause the liquid and the gaseous tensio-active substance to mix at a boundary between the first and second part of the substrate creating a mixture having a lower surface tension than the liquid, wherein the mixture further inhibits the liquid from substantially contacting the second part of the substrate.

2. An apparatus according to claim 1, further comprising a rotational device wherein the rotational device rotates the substrate around an axis which is perpendicular to the substrate, the axis being through a geometric center of the substrate.

3. An apparatus according to claim 2, wherein the substrate is circular shaped and has a first side and a second side, the first side having an annular edge area, wherein the first supply system includes at least one nozzle adapted to supply a stream of liquid on the annular edge area of the substrate;

wherein the second supply system includes at least one nozzle adapted to dispense a gaseous tensio-active substance on an area of the first side adjacent to the annular edge area, the area of the first side being closer to the center of the substrate than the annular edge area; and wherein the at least one nozzles of the first and second supply systems supply a contiguous stream of fluid.

4. An apparatus according to claim 3, wherein the substrate is horizontally placed.

5. An apparatus according to claim 3, wherein the at least one nozzles of the first and second supply systems are positionable on any location along a fixed radius of the substrate.

6. An apparatus according to claim 3, further comprising a nozzle adapted to direct a stream of a treatment liquid onto the entire second side of the substrate.

7. An apparatus according to claim 1, wherein the substrate has a geometric center, an axis which is perpendicular to the substrate at the geometric center of the substrate, a central part around the axis of the substrate and an annular edge, wherein the first supply system includes a first annular channel adapted to supply the liquid to the entire annular edge area of the surface of the substrate, wherein the second supply system includes a central channel adapted to supply a gaseous substance to the central part of the substrate, the central channel being coaxial with the axis of the substrate, and wherein the second supply system further includes a second annular channel placed concentrically with respect to the first channel and closer to the geometric center of the substrate, the second channel adapted to guide the gaseous substance coming from the central part of the substrate, in order to prevent the liquid from touching the central part.

8. An apparatus according to claim 2, wherein the substrate has a central part around the axis of the substrate and an annular edge, wherein the first supply system includes a first annular channel adapted to supply the liquid to the entire annular edge area of the surface of the substrate, wherein the second supply system includes a central channel adapted to supply a gaseous substance to the central part of the substrate, the central channel being coaxial with the axis of the substrate, and wherein the second supply system further includes a second annular channel placed concentrically with respect to the first channel and closer to the geometric center of the substrate, the second channel adapted to guide the gaseous substance coming from the central part of the substrate, in order to prevent the liquid from touching the central part.

9. An apparatus according to claim 7, further comprising a rotational device, wherein the rotational device rotates the apparatus around an axis which is perpendicular to the substrate and which is through the geometric center of the substrate.

10. An apparatus according to claim 7, wherein the substrate has a first side and a second side, and further comprising a nozzle adapted to dispense a stream of a treatment liquid on the entire second side.

11. An apparatus according to claim 7, further comprising a sealing device positioned between the substrate and an outer wall of the second annular channel.

12. An apparatus according to claim 1, wherein the substrate is circular shaped and has two sides with an annular edge and an outer rim, and further comprising:

a container filled with an amount of treatment liquid so that a pressure is maintained above the surface of the amount of treatment liquid, the pressure being less than or equal to an ambient pressure, the container having a narrow gap in one side, into which the circular substrate is partially inserted, so that at least a portion of the annular edge and the outer rim of the substrate is immersed in the liquid, at least one pair of nozzles, one nozzle of the pair on each side of the substrate, directing a stream of a gaseous substance at a border area between the container and the substrate.

13. An apparatus according to claim 2, wherein the substrate is circular shaped and has two sides with an annular edge and an outer rim, and further comprising:

a container filled with an amount of treatment liquid so that a pressure is maintained above the surface of the amount of treatment liquid, the pressure being less than or equal to an ambient pressure, the container having a narrow gap in one side, into which the circular substrate is partially inserted, so that at least a portion of the annular edge and the outer rim of the substrate is immersed in the liquid, at least one pair of nozzles, one nozzle of the pair on each side of the substrate, directing a stream of a gaseous substance at a border area between the container and the substrate.

14. An apparatus according to claim 12, wherein the substrate is positioned in a horizontal plane.

15. An apparatus according to claim 12, further comprising a rotational device, the rotational device rotating the container around an axis which is perpendicular to the substrate, the axis being through a geometric center of the substrate.

16. An apparatus according to claim 1, wherein the first supply system includes a central channel used to supply a stream of liquid to the surface of the substrate and a second channel, concentrically surrounding the first channel, and draining the stream of liquid from the surface of the substrate; and wherein the second supply system includes a third channel, concentrically surrounding the second channel and used to supply a stream of a tensio-active substance to the substrate surface.

17. An apparatus according to claim 16, wherein the substrate is positioned in a horizontal plane.

18. An apparatus according to claim 16, wherein the second supply system further comprises a fourth channel, the fourth channel being concentrically placed with respect to the third channel, the fourth channel being used to drain the gaseous tensio-active substance from the substrate surface.

19. An apparatus according to claims 16, further comprising a sealing device, the sealing device positioned between the substrate and an outer wall of the second channel.

20. An apparatus according to claim 18 further comprising sealing devices, the sealing devices positioned between the substrate and an outer wall of the second channel and between the substrate and an outer wall of the apparatus.

21. An apparatus according to claim 20 wherein the outer wall of the apparatus is an outer wall of the fourth channel.

22. An apparatus according to claim 20 wherein the outer wall of the apparatus is an outer wall of the third channel.

23. An apparatus according to claim 1,
wherein the first supply system includes a central channel, the central channel containing an amount of a liquid such that the liquid is in contact with the surface of the substrate, and that a pressure is maintained above a surface of the amount of liquid, the pressure being less than or equal to an ambient pressure on the substrate surface, and wherein the second supply system includes a second channel, the second channel concentrically surrounding the central channel, and supplying a stream of a gaseous tensio-active substance on the surface of the substrate.

24. An apparatus according to claim 23, wherein the substrate is positioned in a horizontal plane.

25. An apparatus according to claim 23, wherein the second supply system further comprises a third channel, the third channel concentric with respect to the second channel, the third channel being used to drain the gaseous tensio-active substance from the substrate surface.

26. An apparatus according to claim 23, further comprising a sealing device, the sealing device positioned between the substrate and an outer wall of the central channel.

27. An apparatus according to claim 25, further comprising sealing devices, the sealing devices being positioned between the substrate and an outer wall of the central channel and between the substrate and an outer wall of the third channel.

* * * * *